United States Patent
Shih et al.

(10) Patent No.: US 10,700,299 B2
(45) Date of Patent: Jun. 30, 2020

(54) METHOD FOR MANUFACTURING ORGANIC LIGHT EMITTING DIODE USING CONDUCTIVE PROTECTIVE LAYER

(71) Applicant: ZIXU OPTRONICS TECHNOLOGY (SHANGHAI) LIMITED, Shanghai (CN)

(72) Inventors: Kuo-Hsing Shih, Shanghai (CN); Chia-Chen Li, Shanghai (CN); Chin-Rung Yan, Shanghai (CN)

(73) Assignee: ZIXU OPTRONICS TECHNOLOGY (SHANGHAI) LIMITED, Shanghai (CN)

( * ) Notice: Subject to any disclaimer, the term of this patent is extended or adjusted under 35 U.S.C. 154(b) by 0 days.

(21) Appl. No.: 16/051,286

(22) Filed: Jul. 31, 2018

(65) Prior Publication Data

US 2019/0044087 A1    Feb. 7, 2019

Related U.S. Application Data

(60) Provisional application No. 62/540,050, filed on Aug. 1, 2017.

(30) Foreign Application Priority Data

Jun. 21, 2018  (CN) .......................... 2018 1 0642272

(51) Int. Cl.
*H01L 51/50*  (2006.01)
*H01L 51/56*  (2006.01)
(Continued)

(52) U.S. Cl.
CPC ...... *H01L 51/5064* (2013.01); *H01L 27/3211* (2013.01); *H01L 51/0016* (2013.01);
(Continued)

(58) Field of Classification Search
CPC ... H01L 51/5064; H01L 51/508; H01L 51/56; H01L 27/3246; H01L 51/0016
See application file for complete search history.

(56) References Cited

U.S. PATENT DOCUMENTS

2017/0222147 A1*  8/2017  Defranco .............. G03F 7/3021
2018/0033968 A1*  2/2018  Lee ..................... H01L 27/3246
(Continued)

*Primary Examiner* — Daniel Luke
(74) *Attorney, Agent, or Firm* — Maschoff Brennan

(57) ABSTRACT

The present disclosure provides an organic light emitting diode and method for manufacturing the same. The organic light emitting diode includes a substrate; an anode layer formed on a substrate, a hole transmission layer formed on the anode layer, a hole transmission auxiliary layer formed on the hole transmission layer and performed by a photolithography process, wherein the hole transmission auxiliary layer protects a surface of the hole transmission layer, at least one illuminating block formed on the hole transmission auxiliary layer, wherein the hole transmission auxiliary layer is electrically connected between the at least one illuminating block and the hole transmission layer, an electron transmission auxiliary layer formed on the at least one illuminating block; an electron transmission layer formed on the electron transmission auxiliary layer and a cathode layer formed on the electron transmission layer.

3 Claims, 8 Drawing Sheets

(51) Int. Cl.
*H01L 51/00* (2006.01)
*H01L 27/32* (2006.01)

(52) U.S. Cl.
CPC ........ *H01L 51/0018* (2013.01); *H01L 51/508* (2013.01); *H01L 51/56* (2013.01); *H01L 2251/303* (2013.01)

(56) References Cited

U.S. PATENT DOCUMENTS

| | | | |
|---|---|---|---|
| 2018/0047930 A1* | 2/2018 | Lee | H01L 51/0018 |
| 2018/0190907 A1* | 7/2018 | Kim | H01L 51/0016 |
| 2018/0261656 A1* | 9/2018 | Kim | H01L 27/3246 |
| 2018/0261769 A1* | 9/2018 | Kwon | H01L 51/5228 |
| 2019/0019851 A1* | 1/2019 | Chen | H01L 51/5036 |
| 2019/0173046 A1* | 6/2019 | Jeong | H01L 51/0016 |

\* cited by examiner

METHOD FOR MANUFACTURING ORGANIC LIGHT EMITTING DIODE USING CONDUCTIVE PROTECTIVE LAYER

CROSS REFERENCE TO RELATED APPLICATION

This application claims the priority benefit of U.S. Provisional Application Ser. No. 62/540,050, filed Aug. 1, 2017, and Chinese Patent Application Serial Number 201810642272.X, filed on Jun. 21, 2018, the full disclosure of which are incorporated herein by reference.

BACKGROUND

Technical Field

The present disclosure relates to a light emitting diode, and in particular, to an organic light emitting diode and method for manufacturing the same.

Related Art

With the rapid development of the electronics industry, the penetration rate of electronic products, such as computers, tablets or mobile phones, is becoming higher and higher, such as computers, tablets or mobile phones. Those electronic products have become a necessity in people's daily lives. As organic light-emitting diodes (OLEDs) have many advantages such as high chroma, high contrast, wide viewing angle, self-luminous and flexible display, and the like, OLEDs have been widely used.

In the current manufacturing methods, some organic light emitting diodes are manufactured by the photolithography process. However, the materials used for manufacturing the organic light emitting diodes are mostly made of sensitive materials. This would result in poor light emitting efficiency for the organic light emitting diodes. The solvent and the etching solution (or gas) used in the photolithography process are directly in contact with the sensitive materials, which may cause chemical changes in the sensitive material for fabricating the light emitting diodes, and may change the characteristics of the original material.

In the prior art, a protection layer is formed on the surface of the organic light emitting diode before performing the photolithography process on the organic light emitting diode. The protection layer protects the surface of the organic light emitting diode to reduce the affection of the photolithography process on the surface structure. The thickness of the protective layer affects the barrier properties, conductivity, and light transmission of the solvent and the etching solution (or gas). If the thickness of the protective layer is too thin, the barrier property to the solvent and the etching solution (or gas) is poor, and the structural layer is apt to be damaged. If the thickness of the protective layer is too thick, it affects the conductivity of the hole transmission and/or electron transmission, and also affects the light transmittance of the organic light emitting diode. Therefore, the actual luminous efficiency of the organic light emitting diode manufactured by the photolithography process of the prior art is poor.

In addition, if an organic light emitting diode is fabricated using a technology other than the photolithography process, the manufacturing process for the organic light emitting diode may be time consuming and complicated, and the manufacturing process of the organic light emitting diode may not be perfect.

SUMMARY

In view of this, the technical problem to be solved by the present disclosure cannot be solved by the prior art. In the prior art the materials used for manufacturing the organic light emitting diodes are mostly made of sensitive materials, which are directly in contact with the solvent and the etching solution (or gas) used in the photolithography process. This would cause chemical changes in the sensitive material for fabricating the light emitting diodes, and may change the characteristics of the original material. In the prior art, a protection layer is formed on the surface of the organic light emitting diode before performing the photolithography process on the organic light emitting diode. The protection layer protects the surface of the organic light emitting diode to reduce the affection of the photolithography process on the surface structure. However, the thickness of the protective layer affects the hole transmission and/or electron transmission of the organic light emitting diode, resulting in poor luminous efficiency of the organic light emitting diode.

The present disclosure provides an organic light emitting diode, comprising a substrate, an anode layer, a hole transmission layer, a hole transmission auxiliary layer, at least one illuminating block, an electron transmission layer and a cathode layer. The anode layer is formed on the substrate. The hole transmission layer is formed on the anode layer. The hole transmission auxiliary layer is formed on the hole transmission layer and performed by a photolithography process, wherein the hole transmission auxiliary layer protects a surface of the hole transmission layer. The at least one illuminating block is formed on the hole transmission layer, wherein the hole transmission auxiliary layer is electrically connected between the at least one illuminating block and the hole transmission layer. The electron transmission layer is formed on the at least one illuminating block. The cathode layer is formed on the electron transmission layer.

In another embodiment, the organic light emitting diode further comprises an electron transmission auxiliary layer formed between the at least one illuminating block and the electron transmission layer, and performed by a photolithography process, wherein the electron transmission auxiliary layer protects the surface of the at least one illuminating block, and the electron transmission auxiliary layer is electrically connected between the at least one illuminating block and the electron transmission layer.

In another embodiment, the electron transmission auxiliary layer comprises an organic substance, a metal, a metal compound or a combination of at least two of the above.

In another embodiment, the organic substance is a hydrocarbon and other organic substances containing carbon or hydrogen, the metal is lithium, sodium, potassium, rubidium, cesium or barium, and the metal compound is lithium fluoride, sodium fluoride, potassium fluoride, rubidium fluoride, cesium fluoride, barium fluoride, lithium carbonate, sodium carbonate, potassium carbonate, rubidium carbonate, cesium carbonate or barium carbonate.

In another embodiment, the electron transmission auxiliary layer comprises an organic substance, a metal, a metal compound or a combination of at least two of the above.

In another embodiment, the organic substance is a hydrocarbon and other organic substances containing carbon or hydrogen, the metal is lithium, sodium, potassium, rubidium, cesium or barium, and the metal compound is lithium fluoride, sodium fluoride, potassium fluoride, rubidium fluoride, cesium fluoride, barium fluoride, lithium carbonate, sodium carbonate, potassium carbonate, rubidium carbonate, cesium carbonate or barium carbonate.

In another embodiment, the present disclosure provides another organic light emitting diode, comprising a substrate, an anode layer, a hole transmission layer, at least one illuminating block, an electron transmission auxiliary layer, an electron transmission layer, and a cathode layer. The anode layer is formed on the substrate. The hole transmission layer is formed on the anode layer. The at least one illuminating block is formed on the hole transmission layer. The electron transmission auxiliary layer formed on the at least one illuminating block and performed by a photolithography process, wherein the electron transmission auxiliary layer protects a surface of the at least one illuminating block. electron transmission layer formed on the electron transmission auxiliary layer, wherein the electron transmission layer is electrically connected between the electron transmission layer and the at least one illuminating block. The cathode layer is formed on the electron transmission layer.

In another embodiment, the organic light emitting diode further comprises a hole transmission auxiliary layer formed between the hole transmission layer and the at least one illuminating block, and performed by a photolithography process, wherein the hole transmission auxiliary layer protects the surface of the hole transmission layer, and the hole transmission auxiliary layer is electrically connected between the at least one illuminating block and the hole transmission layer.

In another embodiment, the hole transmission auxiliary layer includes an organic substance and a metal oxide.

In another embodiment, the organic substance is a hydrocarbon and other organic substances containing carbon or hydrogen, and the metal oxide is iron oxide, tungsten oxide, indium oxide, tin oxide, indium tin oxide, zinc oxide, titanium oxide, zirconium oxide, molybdenum oxide, silver oxide or gold oxide.

In another embodiment, the electron transmission auxiliary layer comprises an organic substance, a metal, a metal compound or a combination of at least two of the above.

In another embodiment, the organic substance is a hydrocarbon and other organic substances containing carbon or hydrogen, the metal is lithium, sodium, potassium, rubidium, cesium or barium, and the metal compound is lithium fluoride, sodium fluoride, potassium fluoride, rubidium fluoride, cesium fluoride, barium fluoride, lithium carbonate, sodium carbonate, potassium carbonate, rubidium carbonate, cesium carbonate or barium carbonate.

In another embodiment, the present disclosure provides a method for manufacturing an organic light emitting diode comprising depositing an organic layer on a substrate; and depositing a conductive protection layer on the organic layer and performing a photolithography process, the conductive protection layer protecting a surface of the organic layer, the conductive protection layer being as an electrical conductive body of the organic layer.

In another embodiment, the organic layer comprises an anode layer and a hole transmission layer, the conductive protection layer is the hole transmission auxiliary layer. The method further comprises: depositing the anode layer on the substrate; depositing the hole transmission layer on the anode layer; depositing the hole transmission auxiliary layer on the hole transmission layer; coating a photoresist layer on the hole transmission auxiliary layer; masking the photoresist layer with a photomask for exposure; and developing the exposed photoresist layer and removing a portion of the photoresist layer to form a plurality of color light regions exposing portion of the hole transmission auxiliary layer.

In another embodiment, the organic layer further comprises at least one illuminating block, and the conductive protection layer is an electron transmission auxiliary layer. After developing the exposed photoresist layer and removing a portion of the photoresist layer the method further comprises: depositing the at least one illuminating block on the plurality of color light regions; depositing the electron transmission auxiliary layer on the at least one illuminating block; and removing the photoresist layer to expose the electron transmission auxiliary layer.

In another embodiment, the organic layer comprises an anode layer, a hole transmission layer, and at least one light-emitting block, wherein the conductive protection layer is the electron transmission auxiliary layer, the method comprises: depositing the anode layer on the substrate; depositing the hole transmission layer on the anode layer; coating a photoresist layer on the hole transmission layer; masking the photoresist layer with a photomask for exposure; developing the exposed photoresist layer and removing a portion of the photoresist layer to form a plurality of color light regions exposing portion of the hole transmission layer; depositing the at least one light-emitting block on the hole transmission layer; depositing the electron transmission auxiliary layer on the at least one illuminating block; and removing the photoresist layer to expose the electron transmission auxiliary layer.

In another embodiment, after removing the photoresist layer to expose the electron transmission auxiliary layer the method further comprises depositing the electron transmission layer on the electron transmission auxiliary layer; and depositing a cathode layer on the electron transmission layer.

The organic light emitting diode and the method for manufacturing the same may improve the shortcomings of the prior art. The conductive protection layer (that is the hole transmission auxiliary layer or/and the electron transmission auxiliary layer) is deposited in the disclosure to improve photolithography process. The conductive protective layer may prevent the solvent and the etching solution (or gas) used in the photolithography process from directly contacting the sensitive material (that is the hole transmission layer, the illumination block and the electron transmission layer). In the meanwhile, for the organic light emitting diode formed with the conductive protection layer, the conductivity of the conductive protective layer would not adversely affect the transmission efficiency for the hole transmission and/or electron transmission in the OLED structure. Therefore, the effect of the conductive protective layer on the luminous efficiency of the organic light emitting diode structure is very small.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DESCRIPTION OF THE EMBODIMENTS

Figure 1:
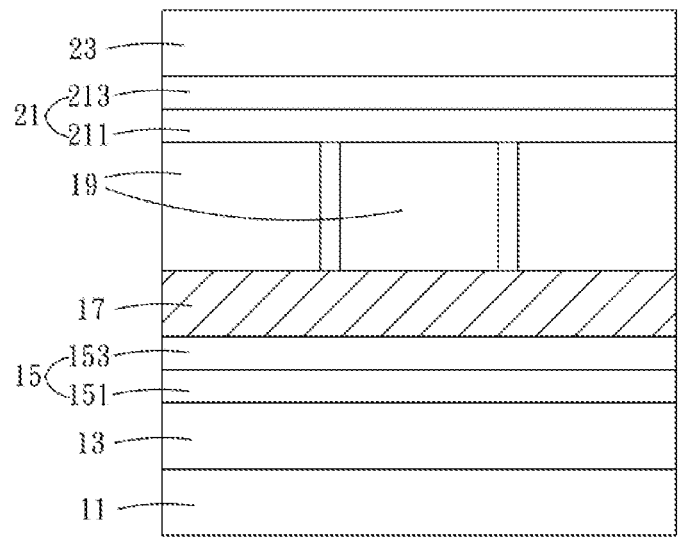
FIG. 1 is a cross-sectional view showing the structure of an organic light emitting diode according to a first embodiment of the present discourse.

The present disclosure will now be described more fully hereinafter with reference to the accompanying drawings, in which exemplary embodiments of the disclosure are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/substantially" means, within an acceptable error range, the person skilled in the art may solve the technical problem in a certain error range to achieve the basic technical effect. Additionally, the term "couple" or "connect" covers any direct or indirect electrically coupling means. Therefore, when one device is electrically connected to another device in the context, that connection may be through a direct electrical connection, or through an indirect electrical connection via other devices and connections. The following description is of the best-contemplated mode of carrying out the disclosure. This description is made for the purpose of illustration of the general principles of the disclosure and should not be taken in a limiting sense. The scope of the disclosure is best determined by reference to the appended claims.

Moreover, the terms "include", "contain", and any variation thereof are intended to cover a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an . . . " does not exclude other same elements existing in the process, the method, the article, or the device which includes the element.

In the following embodiment, the same reference numerals is used to refer to the same or similar elements throughout the disclosure.

Refer to FIG. 1, which is a cross-sectional view showing the structure of an organic light emitting diode according to a first embodiment of the present discourse, As shown in the figure, this embodiment provides an organic light emitting diode 1. At least one configuration is formed on the structure of the organic light emitting diode. This configuration has both conductivity and protection (or barrier) properties. The configuration can prevent a solution, a solvent or a gas used in the manufacturing process from being directly contacting the sensitive materials for making the organic light emitting diode structure. It can avoid the affection on the materials in the manufacturing process, and avoid change if the properties of the original materials, so that the photolithography process can be utilized to manufacture the organic light emitting diode. In this embodiment, the organic light emitting diode 1 comprises a substrate 11, an anode layer 13, a hole transmission layer 15, a hole transmission auxiliary layer 17 (that is the conductive protection layer), at least one illuminating block 19, an electron transmission layer 21 and a cathode layer 23.

The anode layer 13 is formed on the substrate 11. The hole transmission layer 15 is formed on the anode layer 13. The hole transmission auxiliary layer 17 is formed on the hole transmission layer 15 and performed by a photolithography process, wherein the hole transmission auxiliary layer 17 protects a surface of the hole transmission layer 15. The at least one illuminating block 19 is formed on the hole transmission auxiliary layer 17, wherein the hole transmission auxiliary layer 17 is electrically connected between the at least one illuminating block 19 and the hole transmission layer 15. The electron transmission layer 21 is formed on the at least one illuminating block 19. The cathode layer 23 is formed on the electron transmission layer 21.

In this embodiment, the substrate 11 may be glass, silicon, polymer, metal or other materials commonly used for substrates. Those skilled in the art may select the most suitable substrate material according to actual needs, and it is not limited to the materials listed in the embodiment. The anode layer 13 (indium tin oxide, ITO) is disposed on the substrate 11. The anode layer 13 is electrically connected to the positive electrode, and the anode layer 13 supplies a positive charge to the at least one light-emitting block 19. The hole transmission layer 15 includes a hole injection layer (HIL) 151 and a hole transporting layer (HTL) 153. The hole injection layer 151 is formed on the anode layer 13. The hole transporting layer 153 is formed on the hole injection layer 151. At least one illuminating block 19 is formed on the hole transporting layer 153. The hole transmission layer 15 is formed between the anode layer 13 and the at least one illuminating block 19. The hole transmission layer 15 is a hole transmission path in which the anode layer 13 is electrically connected to the illuminating block 19. The illuminating block 19 includes red, green or/and blue colors (RGB). The illuminating block 19 is patterned by a photolithography process to form a pixel. The solution, solvent or gas used in the photolithography process is in direct contact with the sensitive material of the organic light emitting diode 1. The above process would have affection on the materials, even have change for the original properties. Therefore, the hole transmission auxiliary layer 17 (that is the conductive protection layer) is formed on the hole transmission layer 15. The hole transmission auxiliary layer 17 protects the surface of the hole transmission layer 15 in the photolithography process.

The hole transmission auxiliary layer 17 (that is the conductive protection layer) in this embodiment is formed on the hole transmission layer 15. Besides the characteristics and thickness of the material of the hole transmission auxiliary layer 17 itself, it may also serve as a barrier for the protection. The direct contact of the solution, the solvent, or the gas used in the photolithography process with the sensitive material of the organic light emitting diode 1 may be prevented. The material that may facilitate the hole transmission may be selected for the hole transmission auxiliary layer 17. The material for the hole transmission auxiliary layer 17 includes an organic substance and a metal oxide. The organic substance may select a hydrocarbon and other organic substances containing carbon or hydrogen. The metal oxide may select iron oxide, tungsten oxide, indium oxide, tin oxide, indium tin oxide, zinc oxide, titanium oxide, zirconium oxide, molybdenum oxide, silver oxide or gold oxide. The above material is conductive. The material of the hole transmission auxiliary layer 17 enhances the electrical conduction of the hole transmission layer 15, that is, increases the conductivity of the hole transmission layer 15. If the solution, the solvent, or the gas used in the photolithography process affects the conductivity of the hole transmission layer 15 and the hole transmission auxiliary layer 17, the hole transmission auxiliary layer 17 may enhance the conductivity of the combination of the hole transmission layer 15 and the hole transmission auxiliary layer 17. By way of such configuration, the conductivity of the hole transmission layer 15 with or without the hole transmission auxiliary layer 17 would be similar. Furthermore, because the hole transmission auxiliary layer 17 has the function of improving conductivity, the acceptable range for the thickness of the hole transmission auxiliary layer 17 is larger. The problem of the thickness would not cause affection on the conductivity. The thickness of the hole transmission auxiliary layer 17 of the present disclosure is controlled to be a size of 10 Å or more. The structure of the hole transmission auxiliary layer 17 has fewer restrictions, and the process is simple. It is convenient for the user to manufacture and use according to requirements.

Furthermore, the electron transmission layer 21 includes an electron transporting layer 211 (ETL) and an electron injection layer 213 (electron injection layer (EIL)). The electron transporting layer 211 is disposed on the at least one of the illuminating blocks 19. The electron injecting layer 213 is disposed on the electron transporting layer 211. The anode layer 23 is formed on the electron injection layer 213. The cathode layer 23 is connected to the negative electrode, and the cathode layer 23 supplies a negative charge to at least one illuminating block 19.

Figure 2:
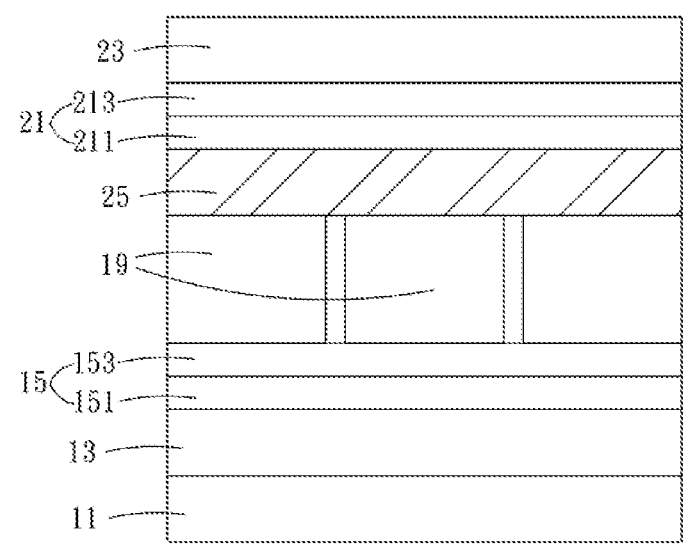
FIG. 2 is a cross-sectional view showing the structure of an organic light emitting diode according to a second embodiment of the present discourse.

Refer to FIG. 2, which is a cross-sectional view showing the structure of an organic light emitting diode according to a second embodiment of the present discourse. As shown in the figure, the difference of this embodiment and the first embodiment lies in that the hole transmission auxiliary layer 17 is not used and the electron transmission auxiliary layer 25 is used instead. The electron transmission auxiliary layer 25 is formed between the at least one illuminating block 19 and the electron transmission layer 21. In this embodiment, the illuminating block 19 is patterned to form a pixel using the photolithography process. The solution, the solvent, or the gas used in the photolithography process directly contacts the sensitive materials of the organic light emitting diode. The photolithography process would have affection on the materials and would even change the original properties of the materials. After the illuminating block 19 is formed, the electron transmission auxiliary layer 25 (that is the conductive protection layer) is formed on the at least one illuminating block 19 and performed by a photolithography process. The electron transmission auxiliary layer 25 protects a surface of the at least one illuminating block 19.

The function of the electron transmission auxiliary layer 25 is similar as the function of the hole transmission auxiliary layer 17. The electron transmission auxiliary layer 25 is formed on at least one illuminating block 19. Besides the thickness of the material of the electron transmission auxiliary layer 25 itself, it may also serve as a barrier for the protection to avoid the direct contact of the solution, the solvent, or the gas used in the photolithography process with the sensitive material of the organic light emitting diode 1. The material that may facilitate the electron transmission may be selected for the electron transmission auxiliary layer 25. The thickness of the electron transmission auxiliary layer 25 of the present disclosure is controlled to a size of 50 Å or more. The material for the electron transmission auxiliary layer 25 may select an organic substance, a metal, a metal compound or a combination of at least two of the above. The combination of at least two of the organic substance, the metal and the metal compound includes a combination of the organic substance and the metal, a combination of the metal and the metal compound, and a combination of the organic substance and the metal compound. The organic substance may select a hydrocarbon and other organic substances containing carbon or hydrogen. The metal may select lithium, sodium, potassium, rubidium, cesium or barium, and the metal compound is lithium fluoride, sodium fluoride, potassium fluoride, rubidium fluoride, cesium fluoride, barium fluoride, lithium carbonate, sodium carbonate, potassium carbonate, rubidium carbonate, cesium carbonate or barium carbonate. The material of the electron transmission auxiliary layer 25 may enhance the electrical conduction of the electron transmission layer 21, the effect of which is similar to the effect of the hole transmission auxiliary layer 17 and would not be described again.

Figure 3:
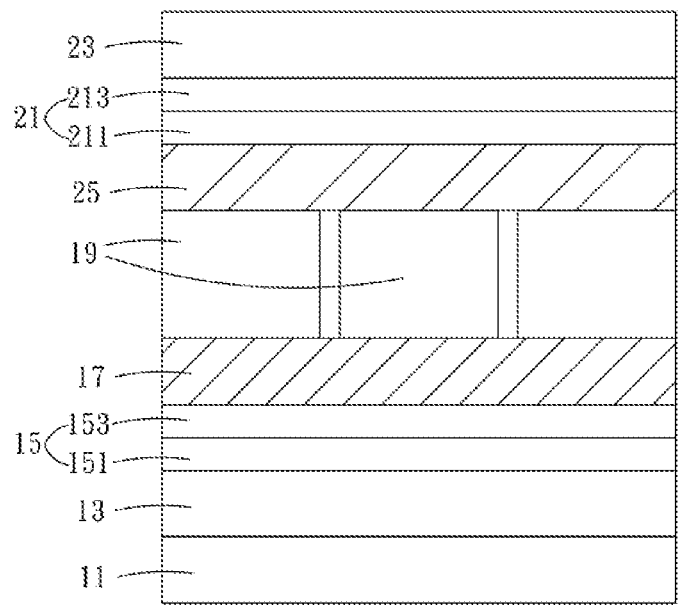
FIG. 3 is a cross-sectional view showing the structure of an organic light emitting diode according to a third embodiment of the present discourse.

Refer to FIG. 3, which is a cross-sectional view showing the structure of an organic light emitting diode according to a third embodiment of the present discourse. As shown in the figure, this embodiment is a combined application of the first embodiment and the second embodiment. The organic light emitting diode 1 of this embodiment includes the hole transmission auxiliary layer 17 and the electron transmission auxiliary layer 25 simultaneously. The configuration and the effects of the hole transmission auxiliary layer 17 and the electron transmission auxiliary layer 25 are similar to those in the first embodiment and the second embodiment and would not be described again.

Figure 4:
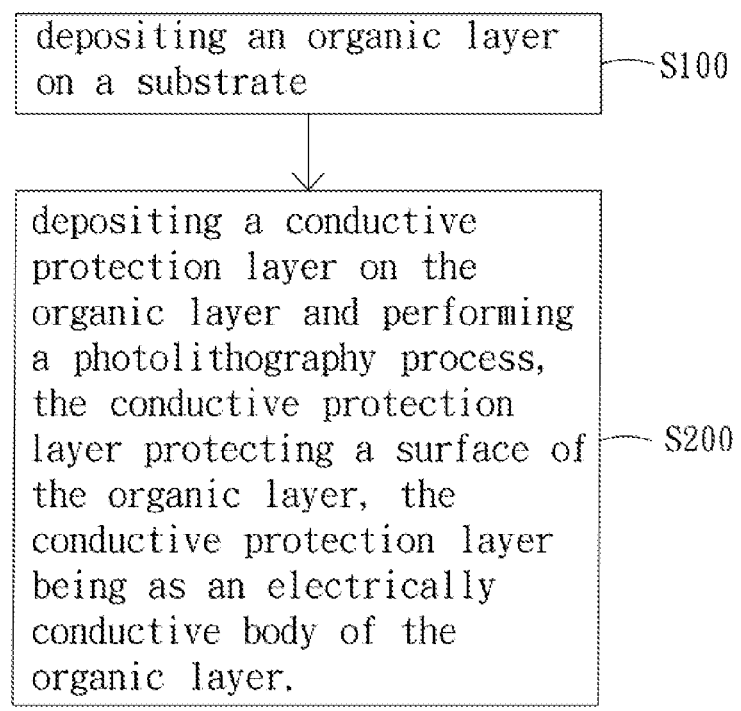
FIG. 4 is a flow chart showing the steps of a method of fabricating an organic light emitting diode structure of the present discourse.

Refer to FIG. 4, which is a flow chart showing the steps of a method of fabricating an organic light emitting diode structure of the present discourse. As shown in the figure, this embodiment involves a step of depositing an organic layer on a substrate 11 (S100). The organic layer may be a configuration including an anode layer 13, a hole transmission layer 15, at least one illuminating block 19, an electron transmission layer 21 or/and a cathode layer 23. The step involves depositing a conductive protection layer (the hole transmission auxiliary layer 17 or the electron transmission auxiliary layer 25) on the organic layer and performing a photolithography process. The conductive protection layer protects a surface of the organic layer. The conductive protection layer serves as an electrically conductive body (hole transmission or electron transmission) of the organic layer. Before performing the photolithography process on the organic light emitting diode 1 every time, the conductive protection layer (the hole transmission auxiliary layer 17 or the electron transmission auxiliary layer 25) may be deposited on the surface of the configuration for protection and increasing the conductivity.

Figure 5A:
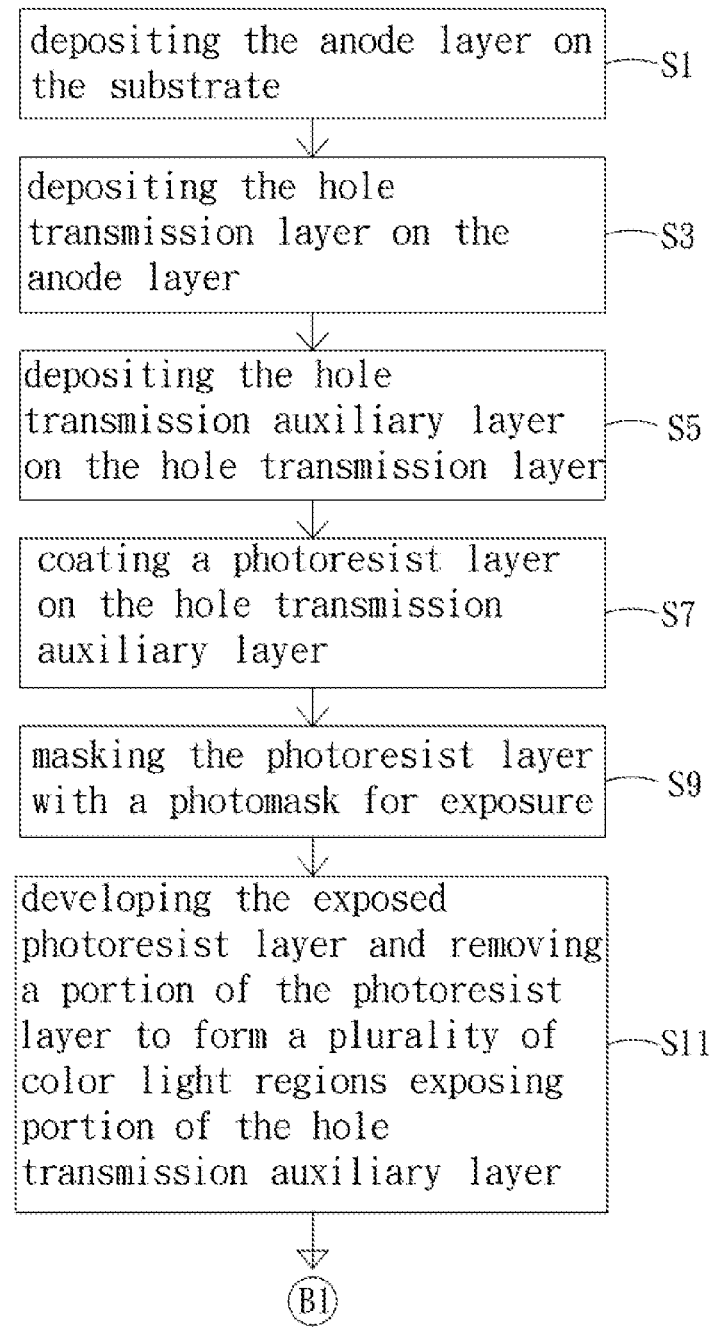
FIGS. 5A and 5B are flow charts showing the steps of a method of fabricating an organic light emitting diode structure of the present discourse.
Figure 5B:
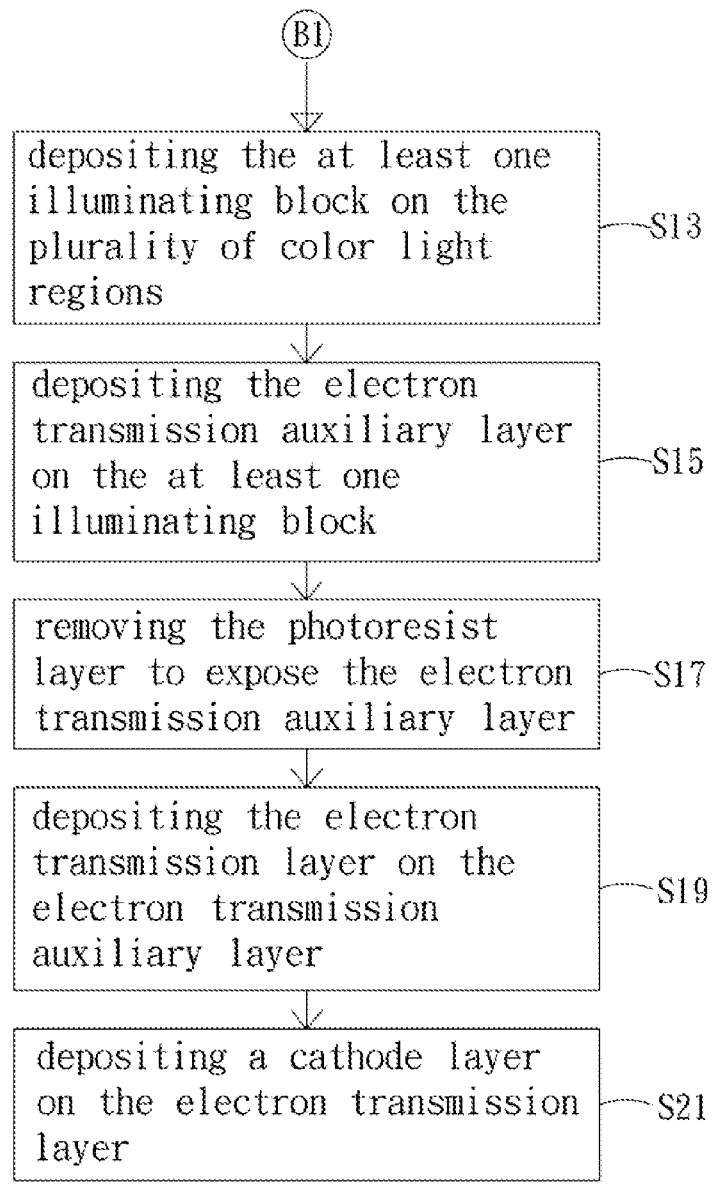

FIGS. 5A and 5B are flow charts showing the steps of a method of fabricating an organic light emitting diode structure of the present discourse; and FIG. 6A to 6I are schematic diagrams showing the steps of a method of fabricating an organic light emitting diode structure of the present disclosure. As shown in the figures, refer to FIG. 6A, the step involves with depositing the anode layer 13 on the substrate 11 (Step S1). A plurality of pixel defining layers (PDL) is formed on the substrate 11 with intervals. the anode layer 13 is formed on the substrate 11 and each anode layer 13 is formed between two pixel defining layers 111. The step involves with depositing the hole transmission layer 15 on the anode layer 13 (step S3). The hole transmission layer 15 covers the pixel defining layers 111 and the anode layer 13. The step then involves with depositing the hole transmission auxiliary layer 17 (that is the conductive protection layer) on the hole transmission layer 15. The hole transmission auxiliary layer 17 covers the surface of the hole transmission layer 15.

Figure 6A:
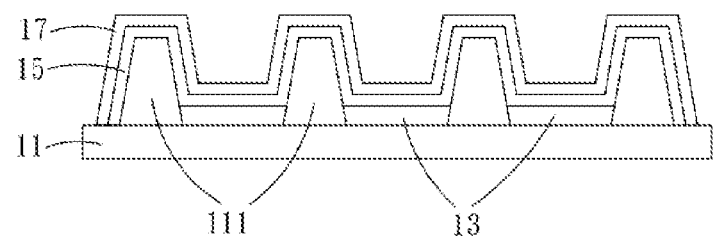
FIG. 6A to 6I are schematic diagrams showing the steps of a method of fabricating an organic light emitting diode structure of the present disclosure.
Figure 6B:
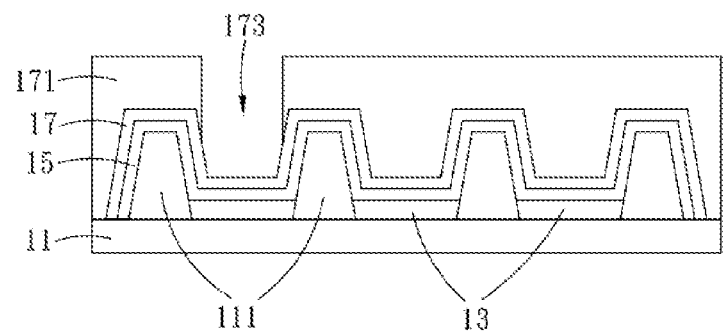

Refer to FIG. 6B, the photolithography process is performed. In the step S7, the photoresist layer 171 is coated on the hole transmission auxiliary layer 17. In the step S9, the photoresist layer 171 is masked with a photomask for exposure. In the step S11, the exposed photoresist layer 171 is developed and a portion of the photoresist layer 171 is removed to form a plurality of color light regions 173 exposing portion of the hole transmission auxiliary layer 17. The gap of the photoresist layer 171 as shown in FIG. 6B is the color light region 173. In this embodiment, the photolithography process may form a plurality of color light regions 173 on the photoresist layer 171 at one time. The plurality of color light regions 173 are deposited with one color. The mass producing is feasible by way of such manner. The photolithography process has a high resolution for the patterns of the organic light emitting diode. The color light regions 173 are formed by developing the removing the photoresist.

Figure 6C:
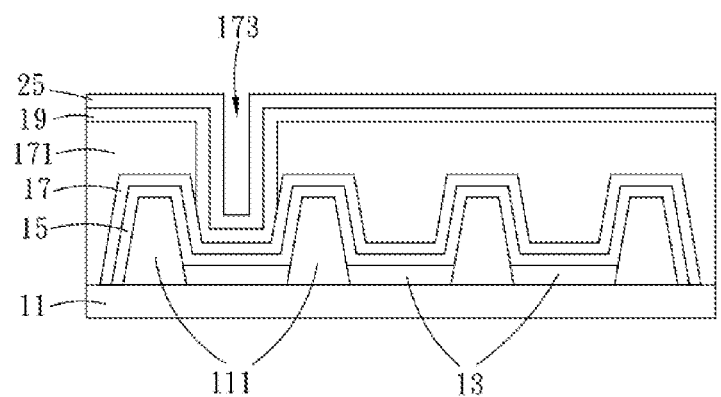
Figure 6D:
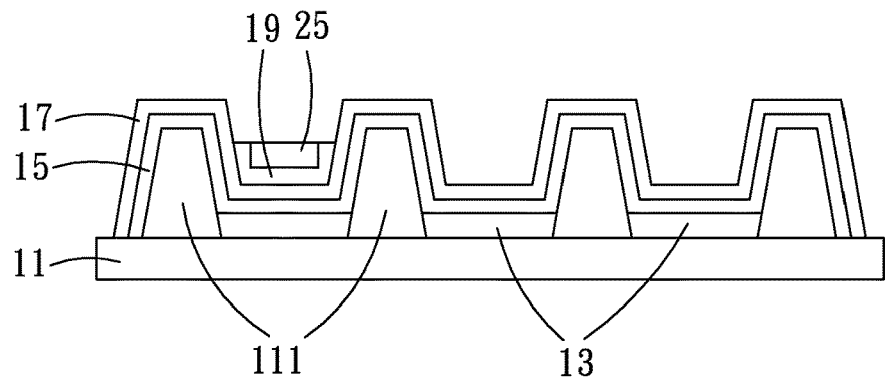
Figure 6E:
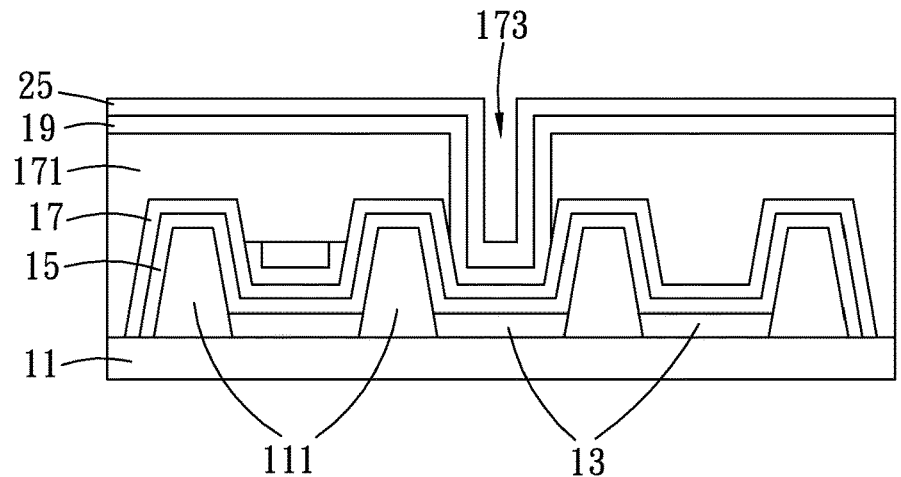
Figure 6F:
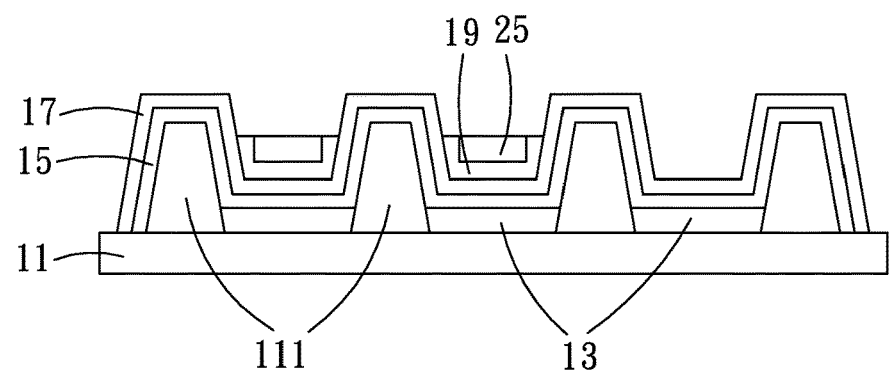

Refer to FIG. 6C, in the step S13, the at least one illuminating block 19 is deposited on the plurality of color light regions 173. The at least one illuminating block 19 is one color, covering the surface of the photoresist layer 171 and the surface of the hole transmission auxiliary layer 17. In the step S15, the electron transmission auxiliary layer 25 is deposited on the at least one illuminating block 19. The electron transmission auxiliary layer 25 covers the at least one illuminating block 19 that is covered in the previous step. Refer to FIG. 6D, in the step S17, the photoresist layer 171 is removed to expose the electron transmission auxiliary layer 25. The at least one illuminating block 19 and the electron transmission auxiliary layer 25 are sequentially stacked on the hole transmission auxiliary layer 17 and between the pixel defining layers 111. Refer to FIGS. 6E, and 6F, the step S7 to S17 of the photolithography process are repeated to form the illuminating block 19 of the second color. The description is not rendered again.

Figure 6G:
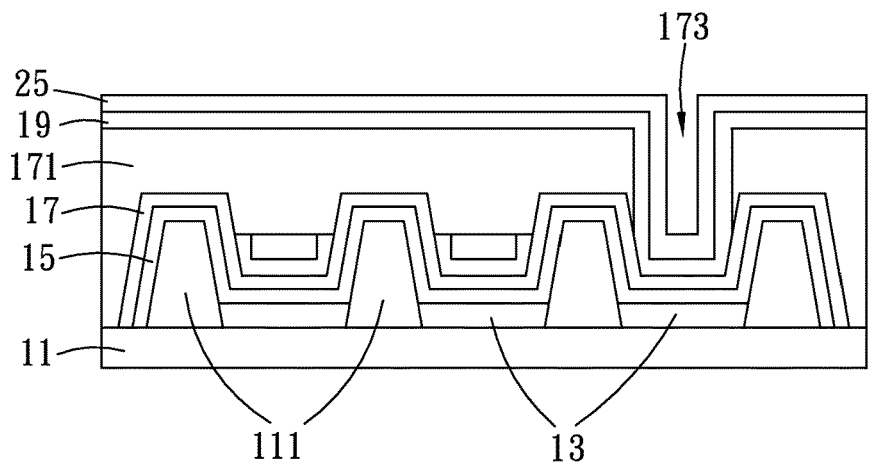
Figure 6H:
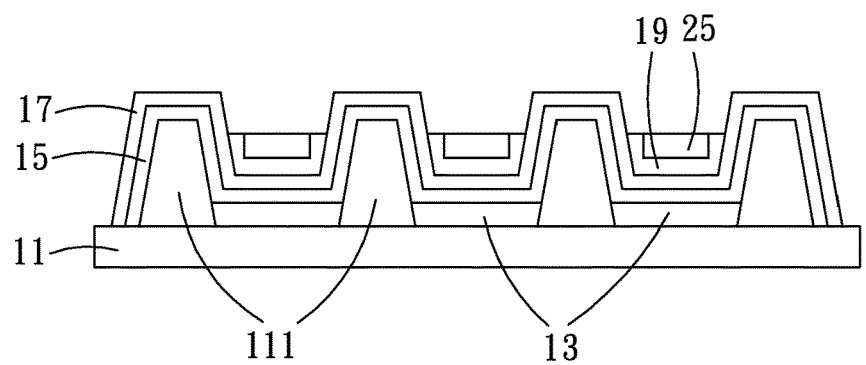

Refer to FIGS. 6G, and 6H, the step S7 to S17 of the photolithography process are repeated again to form the illuminating block 19 of the last color. The electron transmission auxiliary layer 25 covers the top of each color light region 173. The hole transmission auxiliary layer 17 covers the outermost surface. In other words, the hole transmission auxiliary layer 17 and the electron transmission auxiliary layer 25 cover the outermost surface of the organic light emitting diode.

Figure 6I:
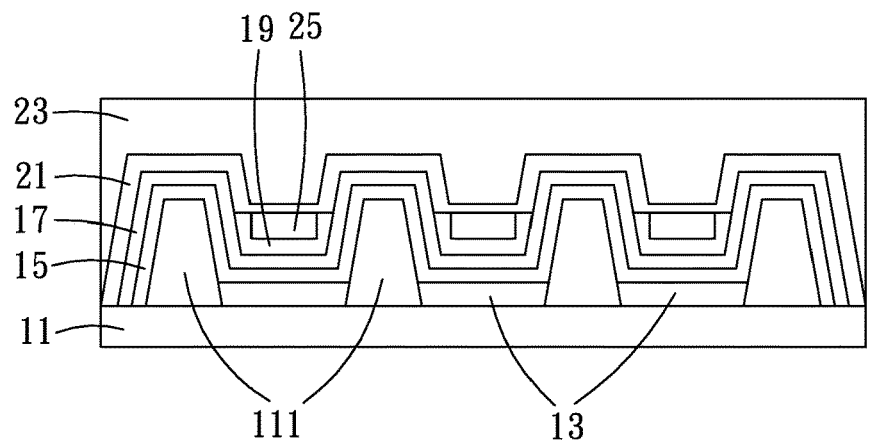

Refer to FIG. 6I, in the step S19, the electron transmission layer 21 is deposited on the electron transmission auxiliary layer 25. The electron transmission layer 21 is further deposited on the hole transmission auxiliary layer 17. In the step of S21, a cathode layer 23 is deposited on the electron transmission layer 21. By way of performing the above steps, the organic light emitting diode 1 is then formed (as shown in FIG. 3).

Furthermore, comparing with the flow charts showing the steps of a method of fabricating an organic light emitting diode in FIGS. 5A and 5B, the step S15 is omitted for the structure shown in FIG. 1, that is the electron transmission auxiliary layer 25 is not deposited. The electron transmission layer 21 is directly deposited on the illuminating block 19. The step S15 is mitted for the structure shown in FIG. 2, that is the hole transmission auxiliary layer 17 is not deposited, and the photolithography process is directly performed and the photoresist layer is coated on the hole transmission layer 15.

In summary, the disclosure provides an organic light emitting diode and a method for manufacturing the same. The conductive protection layer (that is the hole transmission auxiliary layer or/and the electron transmission auxiliary layer) is deposited in the disclosure to improve photolithography process. Besides the thickness of the material of the conductive protection layer itself, it may also serve as a barrier for the protection to avoid the direct contact of the solution, the solvent, or the gas used in the photolithography process with the sensitive material of the organic light emitting diode. The conductive protection layer may increase the conductivity. If the solution, the solvent or the gas used in the photolithography process causes damage on the conductivity of the organic light emitting diode, the conductivity of the organic light emitting diode may be increased by the conductive protection layer such that the expected conductivity of the organic light emitting diode may be achieved. Furthermore, the conductive protection layer has the function of increasing the conductivity. Therefore, the acceptable range for the thickness of the conductive protection layer is larger. The problem of the thickness would not cause affection on the conductivity. The process for making the conductive protective layer is simple and is convenient for the user to implement.

It is to be understood that the term "comprises", "comprising", or any other variants thereof, is intended to encompass a non-exclusive inclusion, such that a process, method, article, or device of a series of elements not only includes those elements but also includes other elements that are not explicitly listed, or elements that are inherent to such a process, method, article, or device. An element defined by the phrase "comprising a . . . " does not exclude the presence of the same element in the process, method, article, or device that comprises the element.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the disclosure. Accordingly, such modifications are considered within the scope of the disclosure as limited solely by the appended claims.

What is claimed is:

1. A method for manufacturing an organic light emitting diode, comprising:

depositing an organic layer on a substrate;
depositing a conductive protection layer on at least a portion of the organic layer and performing a photolithography process, the conductive protection layer protecting a surface of the organic layer, the conductive protection layer acting as an electrically conductive body for the organic layer,
wherein the organic layer comprises an anode layer and a hole transmission layer, the conductive protection layer comprises a hole transmission auxiliary layer, and the method further comprises:
depositing the anode layer on the substrate;
depositing the hole transmission layer on the anode layer;
depositing the hole transmission auxiliary layer on the hole transmission layer;
coating a photoresist layer on the hole transmission auxiliary layer;
masking the photoresist layer with a photomask for exposure; and
developing the exposed photoresist layer and removing a portion of the photoresist layer to form a plurality of color light regions exposing portions of the hole transmission auxiliary layer.

2. The method according to claim 1, wherein:
after developing the exposed photoresist layer and removing a portion of the photoresist layer the method further comprises:
depositing at least one illuminating block on the plurality of color light regions;
depositing an electron transmission auxiliary layer on the at least one illuminating block, wherein the electron transmission auxiliary layer is an other conductive protection layer and protects a surface of the at least one illuminating block; and
removing the photoresist layer to expose the electron transmission auxiliary layer.

3. The method according to claim 2, wherein after removing the photoresist layer to expose the electron transmission auxiliary layer the method further comprises:
depositing an electron transmission layer on the electron transmission auxiliary layer, wherein the electron transmission auxiliary layer acts as an electrically conductive body for the electron transmission layer; and
depositing a cathode layer on the electron transmission layer.

* * * * *